United States Patent
Rindsberg et al.

(10) Patent No.: US 6,553,077 B2
(45) Date of Patent: Apr. 22, 2003

(54) METHOD AND APPARATUS FOR CUSTOMIZED SELECTION OF AUDIO CHANNELS

(75) Inventors: Mark Rindsberg, Boca Raton, FL (US); Paul Marko, Pembroke Pines, FL (US); Jeffrey Malinsky, Fort Lauderdale, FL (US)

(73) Assignee: XM Satellite Radio, Inc., Washington, DC (US)

( * ) Notice: Subject to any disclaimer, the term of this patent is extended or adjusted under 35 U.S.C. 154(b) by 0 days.

(21) Appl. No.: 09/918,881

(22) Filed: Jul. 31, 2001

(65) Prior Publication Data

US 2003/0026344 A1 Feb. 6, 2003

(51) Int. Cl.⁷ .......................... H04K 1/10; H04L 27/28
(52) U.S. Cl. .......................... 375/260; 375/343; 725/48
(58) Field of Search ................. 375/260, 316, 375/138, 343; 455/12.1, 13.1, 3.02, 3.03, 3.04, 45; 725/48, 49, 56, 61, 37, 39

(56) References Cited

U.S. PATENT DOCUMENTS

| | | | | |
|---|---|---|---|---|
| 5,070,404 A | * | 12/1991 | Bullock et al. | 348/460 |
| 5,406,626 A | * | 4/1995 | Ryan | 380/9 |
| 5,455,823 A | * | 10/1995 | Noreen et al. | 370/312 |
| 5,689,806 A | * | 11/1997 | Marko et al. | 455/38.1 |
| 5,751,806 A | * | 5/1998 | Ryan | 380/9 |
| 6,088,455 A | * | 7/2000 | Logan et al. | 380/200 |
| 6,151,059 A | | 11/2000 | Schein et al. | |
| 6,182,287 B1 | | 1/2001 | Schneidewend et al. | |
| 6,330,718 B1 | * | 12/2001 | Shah-Nazaroff et al. | 725/37 |
| 6,347,216 B1 | * | 2/2002 | Marko et al. | 455/12.1 |

OTHER PUBLICATIONS

*Microwave Journal*, "A Combination Monopole/Quadrifilar Helix Antenna for S–Band Terrestrial/Satellite Applications", May 2001; McCarrick, Charles D.

* cited by examiner

*Primary Examiner*—Chi Pham
*Assistant Examiner*—Phuong Phu
(74) *Attorney, Agent, or Firm*—Akerman Senterfitt

(57) ABSTRACT

A method (700) of customizing the selection of channels among a plurality of channels includes the steps of receiving (702) a digitally encoded bit stream over-the-air on the plurality of channels and decoding (704) a selected channel among the plurality of channels. The method further comprises the steps of selectively tagging (706) a desired type of content on the selected channel, analyzing (708) a broadcast information channel and/or an Electronic Program Guide for an indication of content of the desired type among the plurality of channels, and alerting (710) a user of a desired channel containing the indication.

21 Claims, 4 Drawing Sheets

FIG. 4
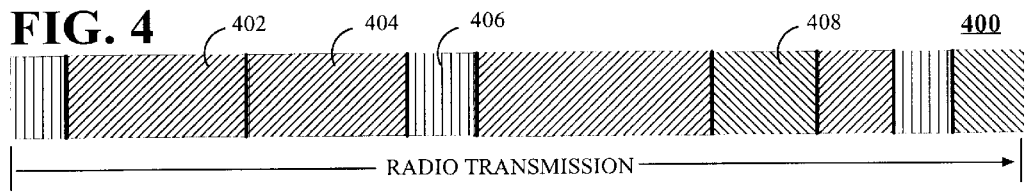
RADIO TRANSMISSION
FIG. 5
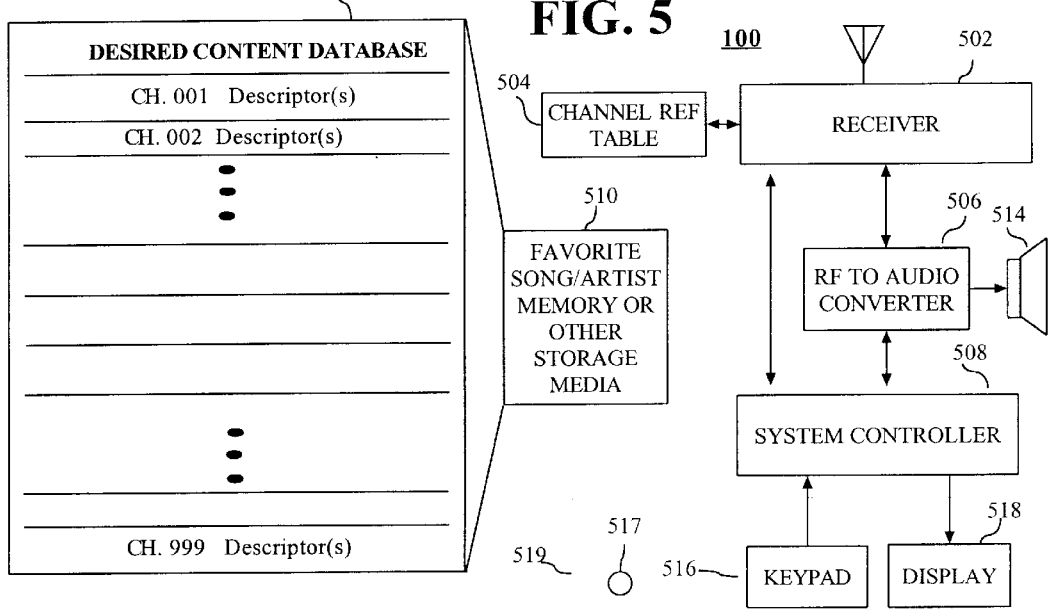
FIG. 6
| CHANNEL | CURRENT/UPCOMING ARTIST | TITLE | ALBUM | GENRE | GUEST | HOST |
|---|---|---|---|---|---|---|
| 1 | GERSHWIN | | RHAPSODY | CLASSICAL | | |
| 2 | | | | | RUSH | BUSH |
| 3 | MADDONA | | VOGUE | ROCK | | |
| 4 | | | | BASEBALL | | |
| 5 | | | | STOCKS | | |
| 6 | | | | FORECAST | | |
| 7 | MARSALIS | | CARNIVAL | CLASSICAL | | |
| 8 | | | | | OPRAH | KING |
| . | | | | | | |
| . | | | | | | |
| . | | | | | | |
| N | STONES | | SATISFACTION | ROCK | | |

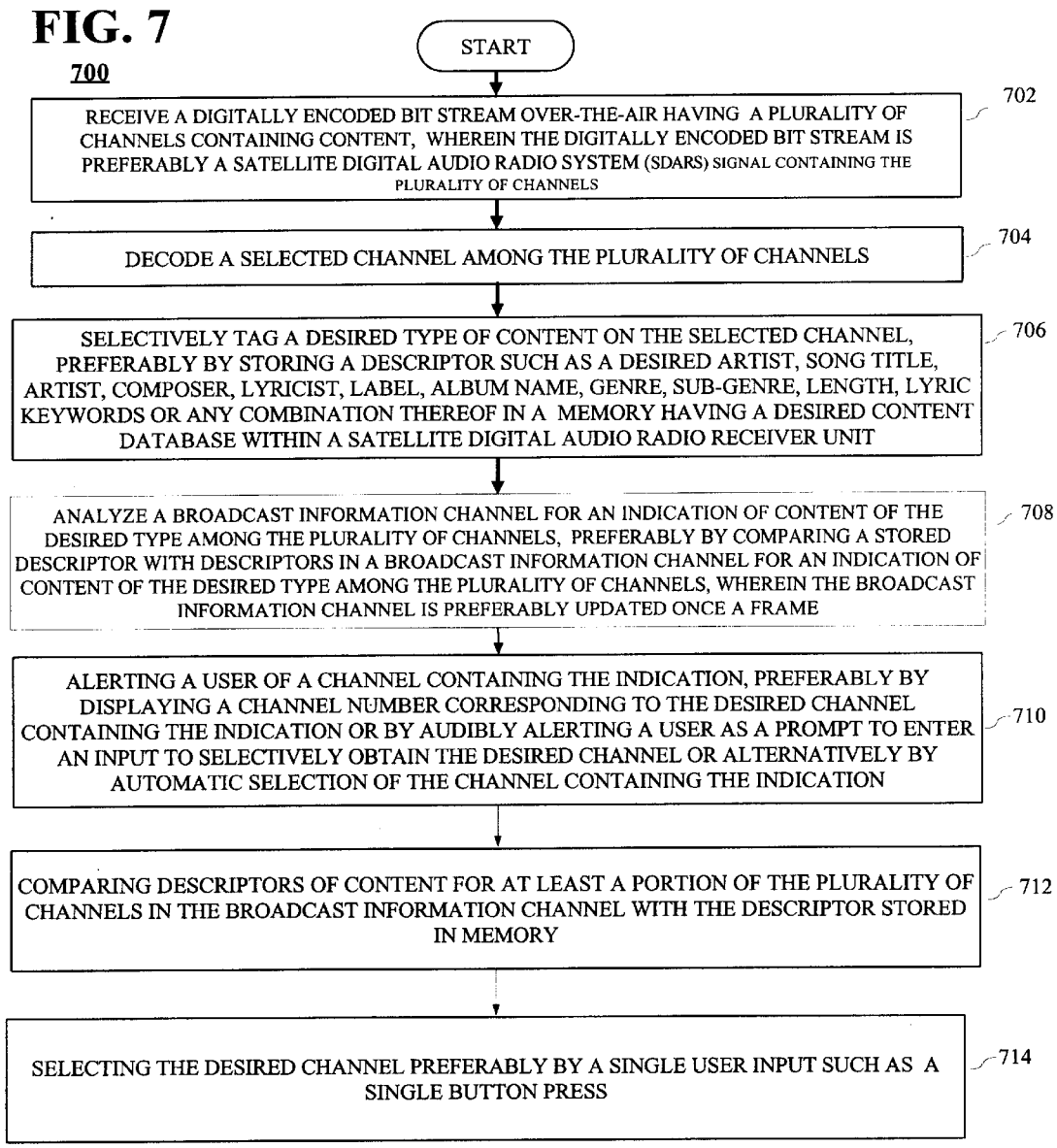

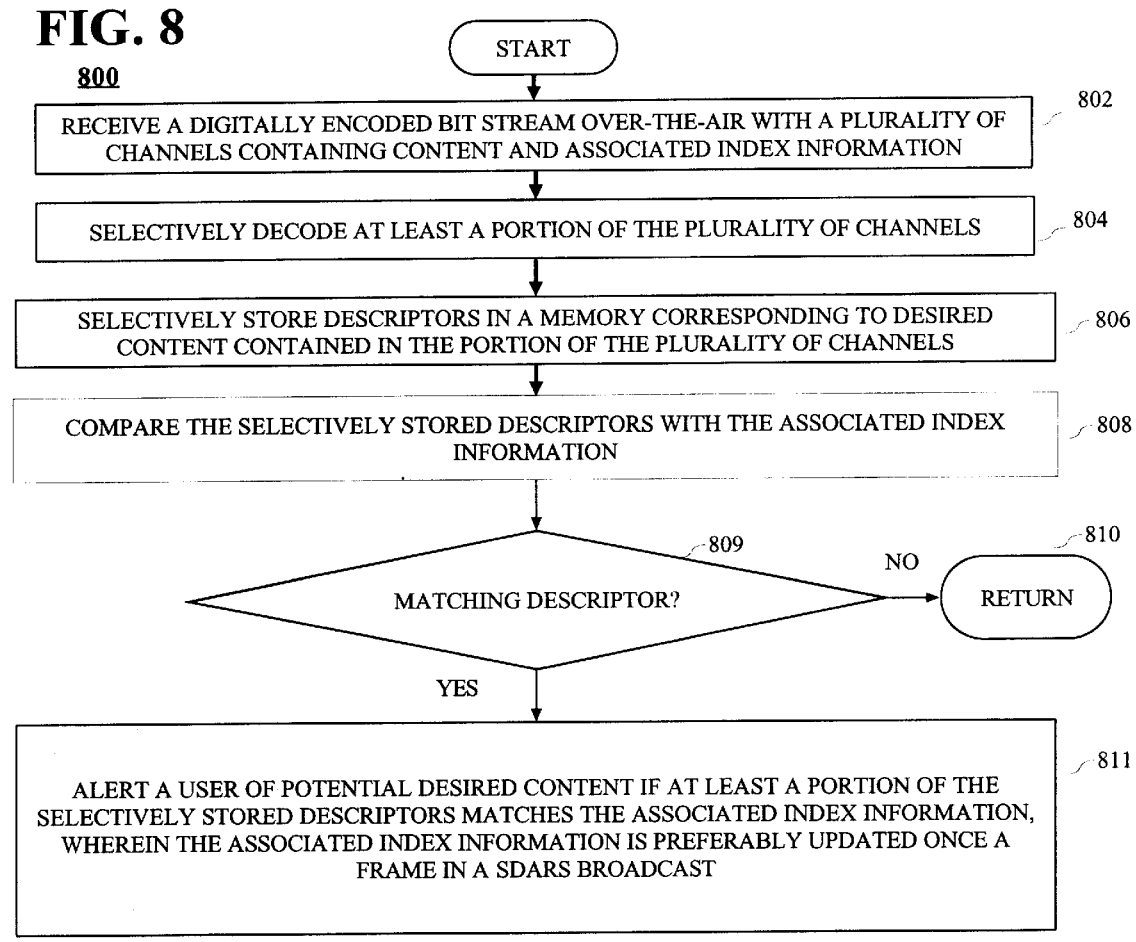

METHOD AND APPARATUS FOR CUSTOMIZED SELECTION OF AUDIO CHANNELS

CROSS-REFERENCE TO RELATED APPLICATIONS (not applicable)

FIELD OF THE INVENTION

The invention relates generally to a method and apparatus for selecting channels, and more particularly to a method and apparatus for enabling selection of channels containing desired content.

BACKGROUND OF THE INVENTION

Satellite radio operators will soon provide digital quality radio broadcast services covering the entire continental United States. These services will offer approximately 100 channels, of which nearly 50 channels in a typical configuration will provide music with the remaining stations offering news, sports, talk and data channels. Digital radio may also be available in the near future from conventional analog radio broadcasters that will provide a terrestrial based system using signals co-located in the AM and FM bands.

Satellite radio has the ability to improve terrestrial radio's potential by offering a better audio quality, greater coverage and fewer commercials. Accordingly, in October of 1997, the Federal Communications Commission (FCC) granted two national satellite radio broadcast licenses. The FCC allocated 25 megahertz (MHZ) of the electro-magnetic spectrum for satellite digital broadcasting, 12.5 MHz of which are owned by Sirius Satellite Radio and 12.5 MHz of which are owned by the assignee of the present application "XM Satellite Radio Inc."

The system plan for each licensee presently includes transmission of substantially the same program content from two or more geosynchronous or geostationary satellites to both mobile and fixed receivers on the ground. In urban canyons and other high population density areas with limited line-of-sight (LOS) satellite coverage, terrestrial repeaters will broadcast the same program content in order to improve coverage reliability. Some mobile receivers will be capable of simultaneously receiving signals from two satellites and one terrestrial repeater for combined spatial, frequency and time diversity, which provides significant mitigation of multipath interference and addresses reception issues associated with blockage of the satellite signals.

In accordance with XM Satellite Radio's unique scheme, the 12.5 MHZ band will be split into 6 slots. Four slots will be used for satellite transmission. The remaining two slots will be used for terrestrial reinforcement.

In accordance with the XM frequency plan, each of two geostationary satellites will transmit identical or at least similar program content. The signals transmitted with QPSK modulation from each satellite (hereinafter satellite 1 and satellite 2). For reliable reception, the LOS signals transmitted from satellite 1 are received, reformatted to Multi-Carrier Modulation (MCM) and rebroadcast by terrestrial repeaters. The assigned 12.5 MHZ bandwidth (hereinafter the "XM" band) is partitioned into two equal ensembles or program groups A and B. Each ensemble will be transmitted by each satellite on a separate radio frequency (RF) carrier. Each RF carrier supports up to 50 channels of music or data in Time Division Multiplex (TDM) format.

Thus, in a digital audio radio system such as the system described above, a need exists for a device that enables a user to intelligently select desired content among the many channels that will be available. A need further exists for a feature in such a system that gives the user an easy way to select the desired type of content and to further retrieve channels containing such desired type of content.

SUMMARY OF THE INVENTION

In a first aspect of the present invention, a method of customizing the selection of channels among a plurality of channels comprises the steps of receiving a digitally encoded bit stream over-the-air on the plurality of channels and decoding a selected channel among the plurality of channels. The method further comprises the steps of selectively tagging a desired type of content on the selected channel, analyzing a broadcast information channel and/or an Electronic Program Guide (hereinafter EPG) for an indication of content of the desired type among the plurality of channels, and alerting a user of a desired channel containing the indication of such desired content.

In a second aspect of the present invention, a method of customized intelligent selection of audio channels among a plurality of channels broadcast over the air comprises the steps of receiving a digitally encoded bit stream over-the-air on the plurality of channels, wherein at least a portion of the plurality of channels contains content and associated channel information and selectively decoding at least a portion of the plurality of channels. The method further comprises of selectively storing descriptors in a non-volatile memory or other storage media corresponding to the desired content on the portion of the plurality channels, comparing the selectively stored descriptors with the associated channel information, and alerting a user of potential desired content if at least a portion of the selectively stored descriptors matches the associated channel information.

In a third aspect of the present invention, a device for receiving, and possibly storing for later playback, digital audio radio signals and intelligently selecting channels containing user-desired content comprises a receiver for receiving a digitally encoded bit stream over-the-air having a plurality of channels. At least a portion of the plurality of channels contains content and associated channel information. The device further comprises a decoder for selectively decoding at least a portion of the plurality of channels and the associated index information, a user input for enabling a user to selectively store descriptors associated with user desired content on at least one of the plurality of channels into a non-volatile memory or other storage media, and a processor or other device programmed to compare the selectively stored descriptors with the associated channel information and further programmed to alert a user of user desired content if at least a portion of the selectively stored descriptors matches the associated channel information.

BRIEF DESCRIPTION OF THE DRAWINGS

FIG. 4 is another diagram illustrating a typical digital radio broadcast transmission in accordance with the present invention.

FIG. 5 is a block diagram of a radio receiver unit with storage media in accordance with the present invention.

FIG. 6 is a chart illustrating a channel reference table in accordance with the present invention.

FIG. 7 is a flowchart illustrating a method in accordance with the present invention.

FIG. 8 is a flowchart illustrating another method in accordance with the present invention.

DETAILED DESCRIPTION OF THE DRAWINGS

Figure 1:
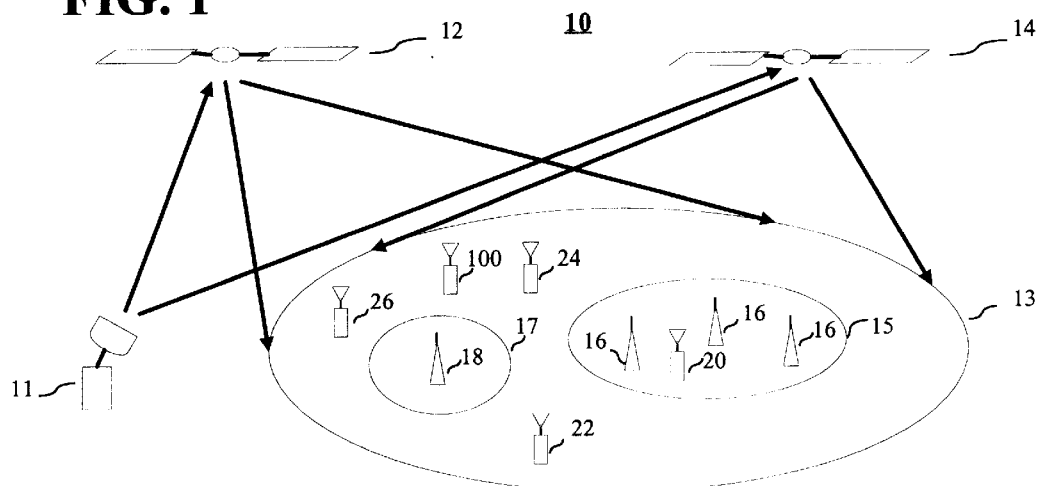
FIG. 1 illustrates a Satellite digital audio radio service system architecture in accordance with the present invention.

Referring to FIG. 1, satellite radio operators will soon provide digital radio service to the continental United States. Briefly, the service provided by XM Satellite Radio includes a satellite X-band uplink (11) to two satellites (12 and 14) which provide frequency translation to the S-band for re-transmission to radio receivers (100, 20, 22, 24, and 26) on earth within the coverage area (13). Radio frequency carriers from one of the satellites are also received by terrestrial repeaters (16 and 18). The content received at the repeaters is retransmitted at a different S-band carrier to the same radios (20) that are within their respective coverage areas (15 and 17). These terrestrial repeaters facilitate reliable reception in geographic areas where LOS reception from the satellites is obscured by tall buildings, hills, tunnels and other obstructions. The signals transmitted by the satellites (12 and 14) and the repeaters are received by SDARS receivers (20–26) as well as receiver unit (100). As depicted in FIG. 1, the receivers may be located in automobiles, handheld or stationary units for home or office use. The SDARS receivers are designed to receive one or both of the satellite signals and the signals from the terrestrial repeaters and combine or select one of the signals as the receiver output.

Figure 2:
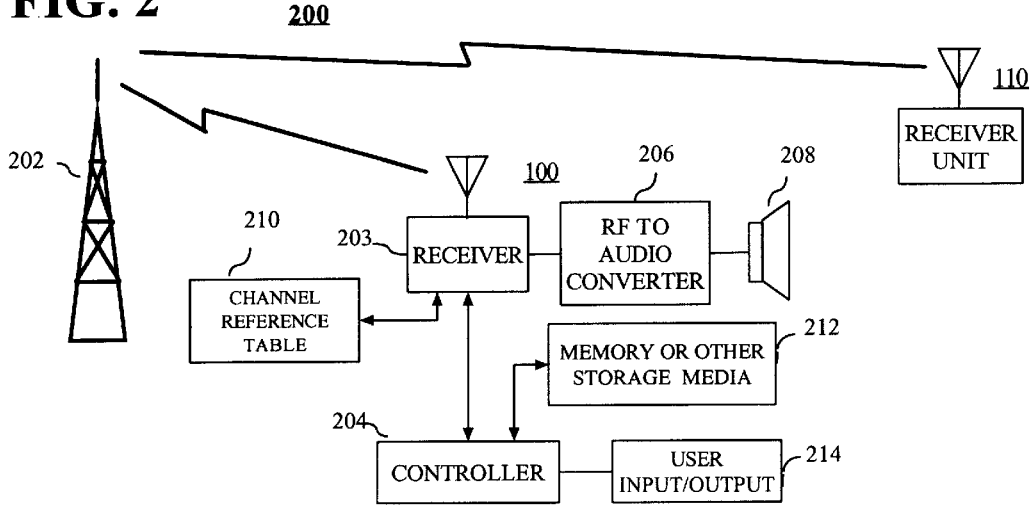
FIG. 2 is a block diagram illustrating a terrestrial based digital audio radio service system architecture in accordance with the present invention.

Referring to FIG. 2, a terrestrial based radio communication system 200 is shown in accordance with present invention. The system 200 preferably comprises a transmission station 202 that transmits signals similar to the repeater stations described above or alternatively could be other transmission formats such as FM, or other modulation techniques suitable for transmission of digital audio. The system 200 also preferably includes a plurality of receiver units (100 and 110 for example) each preferably having a receiver 203, memory 210 and 212 preferably containing a channel reference table and a desired content descriptor list respectively, a controller 204, a user input/output 214 (such as keypads and displays), and a radio frequency to audio converter 206 for playing audio via speaker 208.

Figure 3:
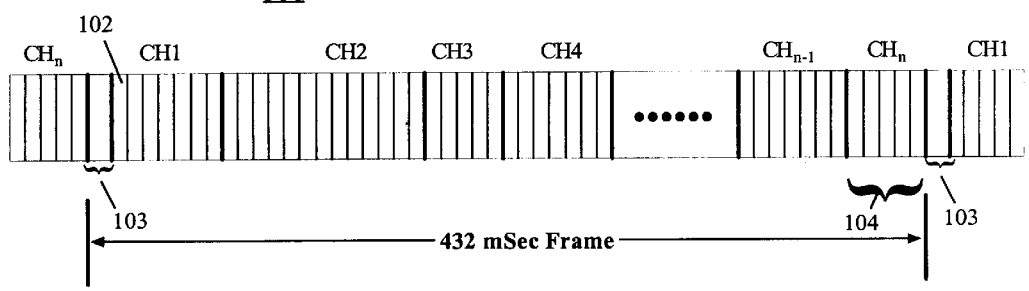
FIG. 3 is a diagram illustrating a representative bit stream in a frame format for distributing data in accordance with the present invention.

Referring to FIG. 3, a plurality of communication resource channels (Channel 1 through n) are shown in accordance with the present invention. In this instance, the over-the-air protocol frame format 300 of the XM Satellite Radio system is shown. This frame format 300 is based on a 432 millisecond frame as shown in FIG. 3 where each frame is subdivided into 8 kilobit per second sub-channels 102. These sub-channels 102 can be dynamically grouped to form higher bit rate payload channels 104. The payload channel or communication resource 104 provides the necessary bandwidth to transport a high-quality digital audio signal to the listener as well as other data as will become more apparent. When a listener changes channels, a receiver in accordance with the present invention simply extracts a different payload channel from the frame 300. It should be noted that each receiver in the XM Satellite System has a unique identifier allowing for the capability of individually addressing each receiver over-the-air to enable or disable services or to provide custom applications such as individual data services or group data services. The frame may also include a broadcast information channel and/or an Electronic Program Guide among channels 1-n which contains information about the remaining channels in the frame. Such information can include descriptors such as song title, artist, composer, lyricist, label, album name, genre (e.g., Latin), sub-genre (e.g., Salsa), length, lyric keywords or any combination thereof. Alternatively, each of the channels in the frame can contain such descriptors for its respective channel in an auxiliary data field for example.

Referring to FIG. 4, an illustration of a typical live radio broadcast transmission 400 is shown composed of various content segments representing music (in segments 402 and 404), live talk (segment 406), and information (segment 408) as examples.

Referring to FIG. 5, a block diagram of a typical subscriber radio or receiver unit 100 in accordance with the present invention is shown in greater detail. The receiver unit 100 preferably comprises a receiver 502 and storage media or memory 510 used to selectively store descriptors corresponding to a portion of the plurality of channels containing user desired content. In other words, the storage media or memory 510 preferably stores a desired content database 512 that has for example a favorite song or artist list or other descriptors. Another memory 514 preferably stores associated channel information or a channel reference table that is updated whenever receiving updated information in the current frame. The RF to audio converter block 506 provides access to the real-time over the air content segments. A system controller 508 enables the routing of information and audio to the user, either visually through a display 518 or audibly through an audio output device 514 such as a speaker. The receiver unit 100 may also have a front panel 519 that contains the display 518 and optionally a keypad 516 for user input. In accordance with one aspect of the present invention, the receiver unit 100 may also include a single button or keypad 517 that would allow a user to input their preferences in the type of content by a single key press. For example, if the user is listening to Aaron Copeland's "Appalachian Spring" on a channel 17, a single button press could enter descriptors into memory 510 indicating that the user prefers to listen to music by Aaron Copeland or to American classical music for example. If the live broadcast on channel 18 contains Aaron Copeland's "Fanfare for the Common Man" or channel 27 contains George Gershwin's "Rhapsody in Blue", then such choices could be alerted to the user via display 518 or alternatively by speaker 514.

Referring to FIG. 6, a chart illustrating a channel reference table in accordance with the present invention is shown. As illustrated, the channel reference table can contain updated information that could be compared with a user's store preference in music or other listening choices. For example, the channel reference table can contain (depending on memory) descriptors relating to current or upcoming artist, song title, album name, title, genre, sub-genre, lyric keywords, talk show host, talk show guest, talk show theme, or data type (such as financial, weather, sports, or traffic). As illustrated, genre and subgenre can be used to identify subject matter descriptors relating to music, talk shows, and data information.

Referring to FIG. 7, a flow chart illustrating a method 700 of customizing the selection of channels among a plurality channels is shown. At step 702 a digitally encoded bit stream is received over-the-air on a plurality of channels, wherein the digitally encoded bit stream is preferably a satellite digital audio radio system (SDARS) signal containing the plurality of channels. It should be understood to be under the scope of the present invention that the bit stream could also be a digital audio radio signal transmitted by other means such as terrestrial FM stations. Then at step 704 the method proceeds by selectively decoding a selected channel among the plurality of channels. At step 706, selectively tagging a desired type of content on the selected channel. The step of tagging preferably comprises the step of storing a descriptor or descriptors as previously described in a memory containing a desired content database. At step 708, the method proceeds to analyze a broadcast information channel and/or an Electronic Program Guide for an indication of content of the desired type, preferably by comparing a stored descriptor (s) in memory with a descriptor(s) in a broadcast information channel and/or an Electronic Program Guide for an indication of content of the desired type among the plurality of channel. Preferably, the broadcast information channel and/or Electronic Program Guide is updated frequently to present the user with the most up-to-date content information about the plurality of channels.

At step 710, the user is alerted of a channel or channels containing an indication of the content of the desired type and ideally such channel number or numbers can be displayed or audibly communicated to the user. The display or audible alert can serve as a prompt to the user to enter an input to select such channels containing the desired content. Alternatively, the alert can comprise the automatic selection of the channel containing the content of the desired type.

Referring to FIG. 8, a flow chart illustrating a method 800 of customized intelligent selection of audio channels among a plurality of channels broadcast over the air is shown. At step 802 a digitally encoded bit stream is received over-the-air on a plurality of channels, wherein each of the plurality of channels contains content and associated channel information. Then at step 804 the method proceeds by selectively decoding at least a portion of the plurality of channels. At step 806, descriptors are selectively stored in a memory, wherein the descriptors correspond to desired content contained in the portion of the plurality of channels. At step 808, the method proceeds to compare the selectively stored descriptor or descriptors with the associated index information. At decision block 809, it is determined if there are any stored descriptors that match descriptors in associated channel information. If no descriptors match, then the method returns to normal programming at block 810. If at least one descriptor matches, then a user can be alerted of potential desired content on a given channel. As previously described above, the alert can come in various forms. Alternatively, a predetermined number of descriptors may need to match before the user is alerted.

The description above is intended by way of example only and is not intended to limit the present invention in any way except as set forth in the following claims.

We claim:

1. A method of customizing the selection of channels among a plurality channels, comprising the steps of:
   receiving a digitally encoded bit stream over-the-air on the plurality of channels, wherein the digitally encoded bit stream contains descriptors representative of the content on at least a portion of the plurality of channels;
   decoding a selected channel among the plurality of channels;
   selectively tagging a desired type of content associated with descriptors on the selected channel;
   analyzing a broadcast information channel or an Electronic Program Guide for an indication of content of the desired type among the plurality of channels; and
   alerting a user of a desired channel containing the indication.

2. The method of claim 1, wherein the step of tagging further comprises the step of storing descriptors representative of the content on the selected channel in a memory.

3. The method of claim 2, wherein the step of analyzing further comprises the step of comparing descriptors of content for at least a portion of the plurality of channels in the broadcast information channel with the descriptor stored in memory.

4. The method of claim 1, wherein the step of alerting further comprises the step of displaying a channel number corresponding to the desired channel containing the indication in real time.

5. The method of claim 1, wherein the step of alerting further comprises the step of audibly alerting a user as a prompt to enter an input to selectively obtain the desired channel in real time.

6. The method of claim 1, wherein the indication of desired content comprises descriptors selected from the group comprising song title, artist, composer, lyricist, label, album name, genre, sub-genre, length, lyric keywords or any combination thereof.

7. The method of claim 1, wherein the digitally encoded bit stream is a satellite digital audio radio signal containing the plurality of channels received on a single tuner.

8. The method of claim 1, wherein the step of selectively tagging comprises the step of storing a descriptor selected among a group of descriptors comprising a desired artist or a song in a channel reference table and/or an Electronic Program Guide in a memory or other media within a satellite digital audio radio receiver unit and the step of analyzing further comprises comparing the descriptor with descriptors in a broadcast information channel for an indication of content of the desired type among the plurality of channels, wherein the broadcast information channel is updated frequently to provide the user with up-to-date information about the plurality of channels.

9. The method of claim 1, wherein the method further comprises the step of selecting the desired channel by a single user input.

10. The method of claim 1, wherein the step of alerting comprises the step of automatically selecting the desired channel without any user input.

11. The method of claim 9, wherein the single user input is a single button press.

12. A method of customized intelligent selection of audio channels among a plurality of channels broadcast over the air, comprising the steps of:
    receiving a digitally encoded bit stream over-the-air on the plurality of channels, wherein at least a portion of the plurality of channels contains content and associated index information;
    selectively decoding at least a portion of the plurality of channels;
    selectively storing descriptors in a memory corresponding to the portion of the plurality channels containing desired content;
    comparing the selectively stored descriptors with the associated index information;
    alerting a user of potential desired content if at least a portion of the selectively stored descriptors matches the associated index information.

13. The method of claim 12, wherein the associated channel information is updated frequently in a satellite digital audio radio signal broadcast.

14. A device for receiving and possibly storing for later playback, digital audio radio signals and intelligently selecting channels containing user desired content, comprises:
- a receiver for receiving a digitally encoded bit stream over-the-air having a plurality of channels, wherein at least a portion of the plurality of channels contains content and associated channel information;
- a decoder for selectively decoding at least a portion of the plurality of channels and the associated channel information;
- a user input for enabling a user to selectively store descriptors associated with user desired content on at least one of the plurality of channels into a memory; and
- a processor programmed to compare the selectively stored descriptors with the associated channel information and further programmed to alert a user of user desired content if at least a portion of the selectively stored descriptors matches the associated channel information.

15. The device of claim 14, wherein the content in the plurality of communication resources is selected from the group comprising music, talk shows, news shows, weather information, traffic information, transportation scheduling information, stock information, or sports information and the descriptors is selected from the group comprising of song title, artist, composer, lyricist, label, album name, genre, sub-genre, length, lyric keywords or any combination thereof.

16. The device of claim 14, wherein the associated index information is broadcast on a separate broadcast information channel that is transmitted and updated frequently to provide the user with up-to-date information about the plurality of channels.

17. The device of claim 14, wherein the associated index information is broadcast on an Electronic Program Guide that is transmitted and updated frequently to provide the user with up-to-date information about the plurality of channels.

18. The device of claim 14, wherein the associated index is stored in a second memory containing a channel reference table and/or information from an Electronic Program Guide having descriptors with at least artist names or song titles and wherein the processor is programmed to compare the second memory with the memory containing descriptors associated with user desired content.

19. The device of claim 14, wherein the device further comprises a radio frequency to audio converter module coupled to an audio output device to access the desired content among the plurality of channels in real time.

20. The device of claim 14, wherein the user input comprises a single button for selecting the channel containing the desired content.

21. The device of claim 14, wherein the desired channel is automatically selected without any user input.

* * * * *